(12) United States Patent
Yonezawa et al.

(10) Patent No.: US 12,451,361 B2
(45) Date of Patent: Oct. 21, 2025

(54) PLASMA PROCESSING METHOD, PLASMA PROCESSING APPARATUS, AND PLASMA PROCESSING SYSTEM

(71) Applicant: Tokyo Electron Limited, Tokyo (JP)

(72) Inventors: Takahiro Yonezawa, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 537 days.

(21) Appl. No.: 17/846,048

(22) Filed: Jun. 22, 2022

(65) Prior Publication Data

US 2022/0406609 A1  Dec. 22, 2022

(30) Foreign Application Priority Data

Jun. 22, 2021 (JP) .................. 2021-103419
Jun. 7, 2022 (JP) .................. 2022-092564

(51) Int. Cl.
*H01L 21/3065* (2006.01)
*H01L 21/02* (2006.01)
*H01L 21/027* (2006.01)
*H01L 21/311* (2006.01)

(52) U.S. Cl.
CPC .... *H01L 21/3065* (2013.01); *H01L 21/02315* (2013.01); *H01L 21/0273* (2013.01); *H01L 21/31116* (2013.01)

(58) Field of Classification Search
CPC ........... H01L 21/3065; H01L 21/02315; H01L 21/0273; H01L 21/31116; H01L 21/31138; H01L 21/31144; H01L 21/0279; H01L 21/67069; H01L 21/0337; H01L 21/0332; H01J 37/32899
See application file for complete search history.

(56) References Cited

U.S. PATENT DOCUMENTS

| | | | |
|---|---|---|---|
| 7,981,812 B2 * | 7/2011 | Chiang | H01L 21/0338 257/E21.216 |
| 9,607,811 B2 * | 3/2017 | Kihara | H01L 21/02258 |
| 10,497,858 B1 * | 12/2019 | Ahn | G11C 11/161 |
| 2009/0050271 A1 | 2/2009 | Goyal et al. | |
| 2012/0238098 A1 * | 9/2012 | Uda | H01L 21/76898 257/E21.232 |
| 2012/0264305 A1 | 10/2012 | Nakano | |
| 2019/0385902 A1 * | 12/2019 | Wang | H01L 21/02167 |
| 2021/0134983 A1 * | 5/2021 | Lin | H10D 30/62 |

FOREIGN PATENT DOCUMENTS

| | | |
|---|---|---|
| JP | 2011-228707 A | 11/2011 |
| JP | 2020-126999 A | 8/2020 |
| WO | 2020/264158 A1 | 12/2020 |

* cited by examiner

*Primary Examiner* — Dale E Page
*Assistant Examiner* — Cristian A Tivarus
(74) *Attorney, Agent, or Firm* — XSENSUS LLP

(57) ABSTRACT

A plasma processing method includes: providing a substrate including: (a) an etching target film; (b) a photoresist film on an upper surface of the etching target film, having a side surface that defines at least one opening in the upper surface of the etching target film; and (c) a first film including a first portion on an upper surface of the photoresist film and second portion on the side surface of the photoresist film, the first portion having a film thickness larger than that of the second portion; and trimming at least a part of the side surface of the photoresist film and at least a part of the second portion of the first film.

26 Claims, 10 Drawing Sheets

PLASMA PROCESSING METHOD, PLASMA PROCESSING APPARATUS, AND PLASMA PROCESSING SYSTEM

CROSS-REFERENCE TO RELATED APPLICATIONS

This application is based on and claims priority from Japanese Patent Application Nos. 2021-103419 and 2022-092564, filed on Jun. 22, 2021 and Jun. 7, 2022, respectively, with the Japan Patent Office, the disclosures of which are incorporated herein in their entireties by reference.

TECHNICAL FIELD

An embodiment of the present disclosure relates to a plasma processing method, a plasma processing apparatus, and a plasma processing system.

BACKGROUND

Japanese Patent Laid-Open No. 2020-126999 discloses a method and an apparatus for processing a substrate as a technique for improving the controllability of a pattern.

SUMMARY

In one embodiment of the present disclosure, a plasma processing method is provided. The plasma processing method includes: providing a substrate including: (a) an etching target film; (b) a photoresist film on an upper surface of the etching target film, having a side surface that defines at least one opening in the upper surface of the etching target film; and (c) a first film including a first portion on an upper surface of the photoresist film and second portion on the side surface of the photoresist film, the first portion having a film thickness larger than that of the second portion; and trimming at least a part of the side surface of the photoresist film and at least a part of the second portion of the first film.

In one embodiment of the present disclosure, a plasma processing apparatus is provided. The plasma processing apparatus includes: a plasma processing chamber; a gas supply unit that supplies a processing gas to the plasma processing chamber; a power supply that supplies power to the plasma processing chamber to generate plasma in the plasma processing chamber; and a control unit. The control unit is configured to cause disposing a substrate including: (a) an etching target film; (b) a photoresist film on an upper surface of the etching target film, having a side surface that defines at least one opening in the upper surface of the etching target film; (c) a first film at least including a first portion on an upper surface of the photoresist film and a second portion on the side surface of the photoresist film, the first portion having a film thickness larger than that of the second portion; and (d) a second film at least on the first portion of the first film, and trimming at least a part of the side surface of the photoresist film and at least a part of the second portion of the first film.

In one embodiment of the present disclosure, a plasma processing system is provided. The plasma processing system includes a first plasma processing apparatus including a first chamber and a second plasma processing apparatus including a second chamber. The first plasma processing apparatus is configured to dispose a substrate including (a) an etching target film, and (b) a photoresist film on an upper surface of the etching target film, having a side surface that defines at least one opening in the upper surface of the etching target film in the first chamber; and in the first chamber, form (c) a first film at least including a first portion on an upper surface of the photoresist film and a second portion on the side surface of the photoresist film, the first portion having a film thickness larger than that of the second portion; and form (d) a second film at least on the first portion of the first film. The second plasma processing apparatus is configured to etch at least a part of the side surface of the photoresist film and at least a part of the second portion of the first film.

In one embodiment of the present disclosure, a plasma processing method is provided. The plasma processing method includes: providing a substrate including (a) an etching target film, and (b) a photoresist film on an upper surface of the etching target film, having a side surface that defines at least one opening in the upper surface of the etching target film; obtaining a ratio of a film thickness of the photoresist film with respect to a dimension of the opening; when the ratio is 1 or more and less than 2; when the ratio is less than 1, forming a first film on the photoresist film; when the ratio is less than 1, forming the first film on the photoresist film; forming a second film on the first film; and trimming at least a part of the side surface of the photoresist film. The first film (c) includes a first portion on an upper surface of the photoresist film and a second portion on the side surface of the photoresist film, in which a film thickness of the first portion is larger than that of the second portion. The second film (d) is formed at least on the first portion of the first film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
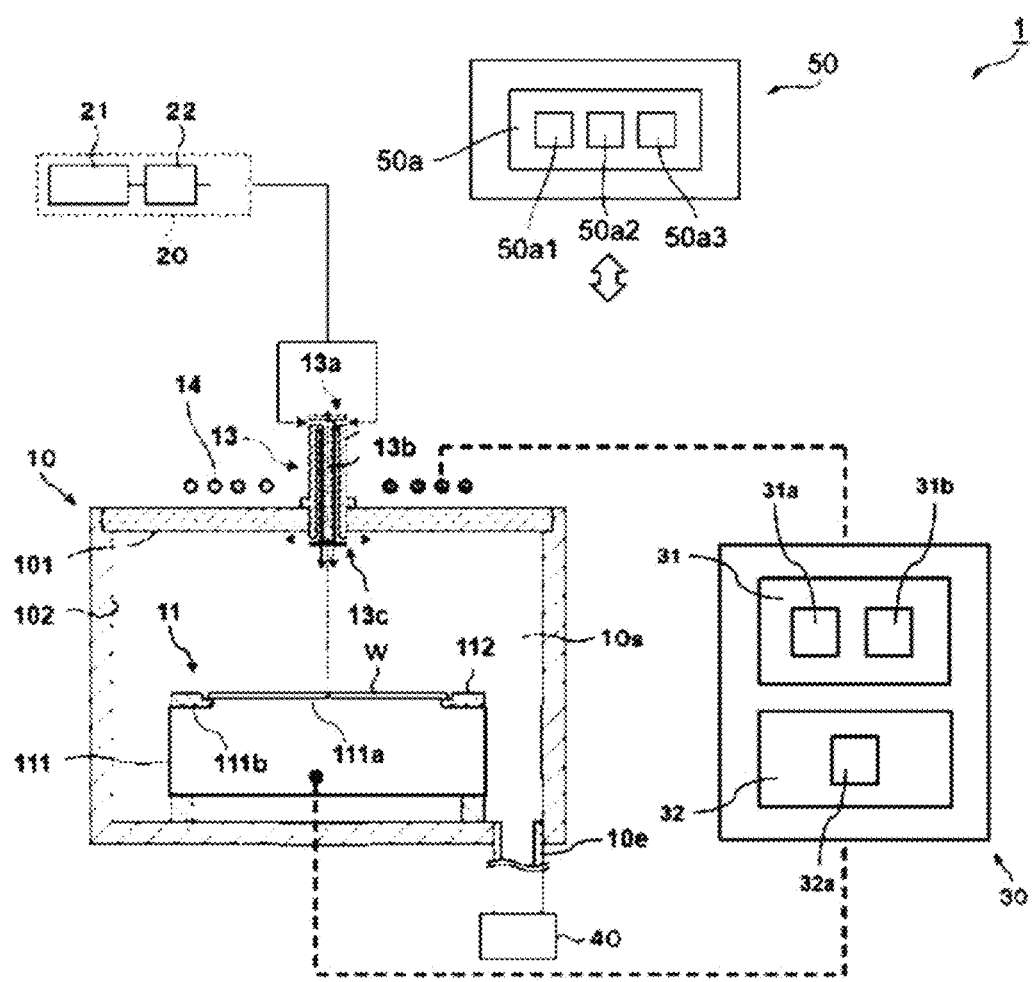
FIG. 1 is a schematic view illustrating a plasma processing apparatus 1 according to one embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, each embodiment of the present disclosure will be described.

In one embodiment, a plasma processing method is provided. The plasma processing method includes: providing a substrate including: (a) an etching target film; (b) a photoresist film on an upper surface of the etching target film, having a side surface that defines at least one opening in the upper surface of the etching target film; and (c) a first film including a first portion on an upper surface of the photoresist film and second portion on the side surface of the photoresist film, the first portion having a film thickness larger than that of the second portion; and trimming at least a part of the side surface of the photoresist film and at least a part of the second portion of the first film.

In one embodiment, the providing the substrate includes forming a second film at least on the first portion of the first film.

In one embodiment, the plasma processing method further includes, after the trimming, etching the etching target film using the photoresist film, the first film, and the second film as a mask.

In one embodiment, the side surface of the photoresist film includes at least one of a recess and a protrusion protruding from the side surface to the opening.

In one embodiment, the protrusion extends from the side surface of the photoresist film to the upper surface of the etching target film.

In one embodiment, the first film is an organic film, and the second film is an inorganic film.

In one embodiment, the photoresist film is a Sn-containing film.

In one embodiment, the inorganic film is a metal-containing film or a Si-containing film.

In one embodiment, the metal-containing film is a Sn-containing film.

In one embodiment, the metal-containing film is a W-containing film, a Ti-containing film, or an Al-containing film.

In one embodiment, the inorganic film is a non-metal inorganic film containing boron, phosphorus, or sulfur.

In one embodiment, the trimming is performed using plasma generated from a predetermined processing gas, and an etching rate of the first film with respect to the generated plasma is larger than an etching rate of the second film with respect to the generated plasma.

In one embodiment, the predetermined processing gas contains an oxygen-containing gas and a halogen-containing gas.

In one embodiment, the first film and the second film are formed by a plasma CVD.

In one embodiment, the first film is formed using plasma generated from a gas containing a carbon-containing gas, and the second film is formed using plasma generated from a gas containing a Si-containing gas.

In one embodiment, the carbon-containing gas is $C_xH_y$ (x and y are integers of 1 or more), $C_tH_uF_v$ (t and v are integers of 1 or more and u is an integer of 0 or more), CO, or $CO_2$.

In one embodiment, the film thickness of the first portion of the first film is larger than a film thickness of the photoresist film and the film thickness of the second film.

In one embodiment, the etching etches the etching target film and the second film.

In one embodiment, the etching target film is a Si-containing film, and the second film is a Si-containing film.

In one embodiment, the trimming and the etching are performed in a same chamber.

In one embodiment, the trimming includes: measuring a dimension of the opening defined on the etching target film by the side surface trimmed in the trimming; forming a third film on the side surface trimmed in the trimming based on the measured dimension; and etching a part of the third film.

In one embodiment, the third film contains an organic film.

In one embodiment, the third film is a stacked film including the organic film and an inorganic film on the organic film.

In one embodiment, the trimming further includes repeating the measuring of the dimension of the opening, the forming of the third film, and the etching of a part of the third film.

In one embodiment, a plasma processing apparatus is provided. The plasma processing apparatus includes: a plasma processing chamber; a gas supply unit that supplies a processing gas to the plasma processing chamber; a power supply that supplies power to the plasma processing chamber to generate plasma in the plasma processing chamber; and a control unit. The control unit is configured to cause disposing a substrate including: (a) an etching target film; (b) a photoresist film on an upper surface of the etching target film, having a side surface that defines at least one opening in the upper surface of the etching target film; (c) a first film at least including a first portion on an upper surface of the photoresist film and a second portion on the side surface of the photoresist film, the first portion having a film thickness larger than that of the second portion; and (d) a second film at least on the first portion of the first film, and trimming at least a part of the side surface of the photoresist film and at least a part of the second portion of the first film.

In one embodiment, a plasma processing system is provided. The plasma processing system includes a first plasma processing apparatus including a first chamber and a second plasma processing apparatus including a second chamber. The first plasma processing apparatus is configured to dispose a substrate including (a) an etching target film, and (b) a photoresist film on an upper surface of the etching target film, having a side surface that defines at least one opening in the upper surface of the etching target film in the first chamber, and in the first chamber, forms (c) a first film at least including a first portion on an upper surface of the photoresist film and a second portion on the side surface of the photoresist film, the first portion having a film thickness larger than that of the second portion; and forms (d) a second film at least on the first portion of the first film. The second plasma processing apparatus is configured to etch at least a part of the side surface of the photoresist film and at least a part of the second portion of the first film.

In one embodiment, a plasma processing method is provided. The plasma processing method includes: providing a substrate including (a) an etching target film, and (b) a photoresist film on an upper surface of the etching target film, having a side surface that defines at least one opening in the upper surface of the etching target film; obtaining a ratio of a film thickness of the photoresist film with respect to a dimension of the opening; when the ratio is 1 or more and less than 2, forming a first film on the photoresist film; when the ratio is less than 1, forming the first film on the photoresist film, and forming a second film on the first film; and trimming at least a part of the side surface of the photoresist film. The first film (c) includes a first portion on an upper surface of the photoresist film and a second portion on the side surface of the photoresist film, in which a film thickness of the first portion is larger than that of the second portion. The second film (d) is formed at least on the first portion of the first film.

Hereinafter, each embodiment of the present disclosure will be described with reference to the drawings. In each drawing, the same or similar elements are designated by the same reference numerals, and duplicate description will be omitted. Unless otherwise specified, the positional relationship such as up, down, left and right will be described based on the positional relationship illustrated in the drawings. The dimensional ratio in the drawings does not indicate the actual ratio, and the actual ratio is not limited to the illustrated ratio.

[Configuration of Plasma Processing Apparatus 1]

FIG. 1 is a schematic view illustrating a plasma processing apparatus 1 according to one embodiment. The plasma processing method (hereinafter, referred to as "the processing method") according to one embodiment may be performed using the plasma processing apparatus 1.

The plasma processing apparatus 1 is a capacitively-coupled processing apparatus. The plasma processing apparatus 1 includes a plasma processing chamber 10, a gas supply unit 20, a power supply 30, and an exhaust system 40. The plasma processing chamber 10 includes a dielectric window 101. Further, the plasma processing apparatus 1 includes a substrate support unit 11, a gas introducer 13, and an antenna 14. The substrate support unit 11 is disposed inside the plasma processing chamber 10. The antenna 14 is disposed on or above the plasma processing chamber 10 (i.e., on or above the dielectric window 101). The plasma processing chamber 10 includes a plasma processing space 10s defined by the dielectric window 101, a side wall 102 of the plasma processing chamber 10, and the substrate support unit 11. Further, the plasma processing chamber 10 has at least one gas supply port configured to supply at least one processing gas to the plasma processing space, and at least one gas discharge port configured to discharge a gas from the plasma processing space. The gas supply port is connected to a gas supply unit 20 (to be described later), and the gas discharge port is connected to an exhaust system 40 (to be described later). The substrate support unit 11 is disposed inside the plasma processing space, and includes a substrate support surface that supports a substrate.

The substrate support unit 11 includes a body 111 and a ring assembly 112. The body 111 includes a central area (substrate support surface) 111a that supports a substrate (wafer) W, and an annular area (ring support surface) 111b that supports the ring assembly 112. The annular area 111b of the body 111 surrounds the central area 111a of the body 111 viewed in a plane view. The substrate W is disposed on the central area 111a of the body 111, and the ring assembly 112 is disposed on the annular area 111b of the body 111 so as to surround the substrate W on the central area 111a of the body 111. In the embodiment, the body 111 includes a base and an electrostatic chuck. The base includes a conductive member. The conductive member of the base functions as a lower electrode. The electrostatic chuck is disposed on the base. An upper surface of the electrostatic chuck includes the substrate support surface 111a. The ring assembly 112 includes one or more annular members. At least one of the one or more annular members is an edge ring. Further, although not illustrated, the substrate support unit 11 may include a temperature adjusting module configured to adjust at least one of the electrostatic chuck, the ring assembly 112, and the substrate to a target temperature. The temperature adjusting module may include a heater, a heat transfer medium, a flow path, or a combination thereof. A heat transfer fluid such as brine or a gas flows through the flow path. Further, the substrate support unit 11 may include a heat transfer gas supply unit configured to supply a heat transfer gas between a rear surface of the substrate W and the substrate support surface 111a.

The gas introducer is configured to introduce at least one processing gas from the gas supply unit 20 to the plasma processing space 10s. In the embodiment, the gas introducer includes a center gas injector (CGI) 13. The center gas injector 13 is disposed above the substrate support unit 11, and is attached to a central opening formed in the dielectric window 101. The center gas injector 13 includes at least one gas supply port 13a, at least one gas flow path 13b, and at least one gas introducing port 13c. The processing gas supplied to the gas supply port 13a passes through the gas flow path 13b and introduces from the gas introducing port 13c to the plasma processing space 10s. In addition to or instead of the center gas injector 13, the gas introducer may include one or more side gas injectors (SGI) attached to one or more openings formed in the side wall 102.

The gas supply unit 20 may include at least one gas source 21 and at least one flow rate controller 22. In the embodiment, the gas supply unit 20 is configured to supply at least one processing gas from the corresponding gas source 21 to the gas introducer 13 via the corresponding flow rate controller 22. Each flow rate controller 22 may include, for example, a mass flow controller or a pressure-control type flow rate controller. The gas supply unit 20 may further include at least one flow rate modulating device that modulates or pulses the flow rate of at least one processing gas.

The power supply 30 includes a RF power supply 31 coupled to the plasma processing chamber 10 via at least one impedance matching circuit. The RF power supply 31 is configured to supply at least one RF signal (RF power) such as a source RF signal or a bias RF signal to the conductive member of the substrate support unit 11 and the antenna 14. Therefore, plasma is generated from at least one processing gas supplied to the plasma processing space 10s. Therefore, the RF power supply 31 may function as at least a part of a plasma generation unit 12. Further, by supplying the bias RF signal to the conductive member of the substrate support unit 11, a bias potential is generated in the substrate W, and an ion in the formed plasma may be drawn into the substrate W.

In the embodiment, the RF power supply 31 includes a first RF generation unit 31a and a second RF generation unit 31b. The first RF generation unit 31A is configured to be coupled to the antenna 14 via at least one impedance matching circuit, and generate a source RF signal (source RF power) for plasma generation. In the embodiment, the source RF signal has a frequency within a range of 13 MHz to 150 MHz. In the embodiment, the first RF generation unit 31a may be configured to generate a plurality of source RF signals having different frequencies. The generated one or more source RF signals are supplied to the antenna 14. The second RF generation unit 31b is configured to be coupled to the conductive member of the substrate support unit 11 via at least one impedance matching circuit, and generate the bias RF signal (bias RF power). In the embodiment, the bias RF signal has a frequency lower than that of the source RF signal. In the embodiment, the bias RF signal has a frequency within a range of 400 kHz to 13.56 MHz. In the embodiment, the second RF generation unit 31b may be configured to generate a plurality of bias RF signals having different frequencies. The generated one or more bias RF signals are supplied to the conductive member of the substrate support unit 11. Further, in various embodiments, at least one of the source RF signal and the bias RF signal may be pulsed.

Further, the power supply 30 may include a DC power supply 32 coupled to the plasma processing chamber 10. The DC power supply 32 includes a bias DC generation unit 32a. In the embodiment, the DC generation unit 32a is configured to be connected to the conductive member of the substrate support unit 11 and generate a bias DC signal. The generated bias DC signal is applied to the conductive member of the substrate support unit 11. In the embodiment, the bias DC signal may be applied to another electrode such as an electrode in the electrostatic chuck. In various embodiments, the bias DC signal may be pulsed. The bias DC generation unit 32a may be provided in addition to the RF power supply 31, or may be provided instead of the second RF generation unit 31b.

The antenna 14 includes one or more coils. In the embodiment, the antenna 14 may include an outer coil and an inner coil disposed coaxially. In this case, the RF power supply 31 may be connected to both the outer coil and the inner coil, or may be connected to any one of the outer coil and the inner coil. In the former case, the same RF generation unit may be connected to both the outer coil and the inner coil, or separate RF generation units may be separately connected to the outer coil and the inner coil.

The exhaust system 40 may be connected to, for example, a gas exhaust port 10e provided in a bottom portion of the plasma processing chamber 10. The exhaust system 40 may include a pressure adjustment valve and a vacuum pump. The pressure in the plasma processing space 10s is adjusted by the pressure adjustment valve. The vacuum pump may include a turbo molecular pump, a dry pump, or a combination thereof.

The control unit 50 processes computer-executable instructions that cause the plasma processing apparatus 1 to perform the various steps described in the present disclosure. The control unit 50 may be configured to control each element of the plasma processing apparatus 1 so as to perform the various steps described here. In the embodiment, a part of or the entire control unit 50 may be included in the plasma processing apparatus 1. The control unit 50 may include, for example, a computer 50a. The computer 50a may include, for example, a processor (central processing unit: CPU) 50a1, a storage unit 50a2, and a communication interface 50a3. The processor 50a1 may be configured to execute various control operations based on a program stored in the storage unit 50a2. The storage unit 50a2 may include a random access memory (RAM), a read only memory (ROM), a hard disk drive (HDD), a solid state drive (SDD), or a combination thereof. The communication interface 50a3 may communicate with the plasma processing apparatus 1 via a communication line such as a local area network (LAN).

[Configuration of Substrate Processing System PS]

Figure 2:
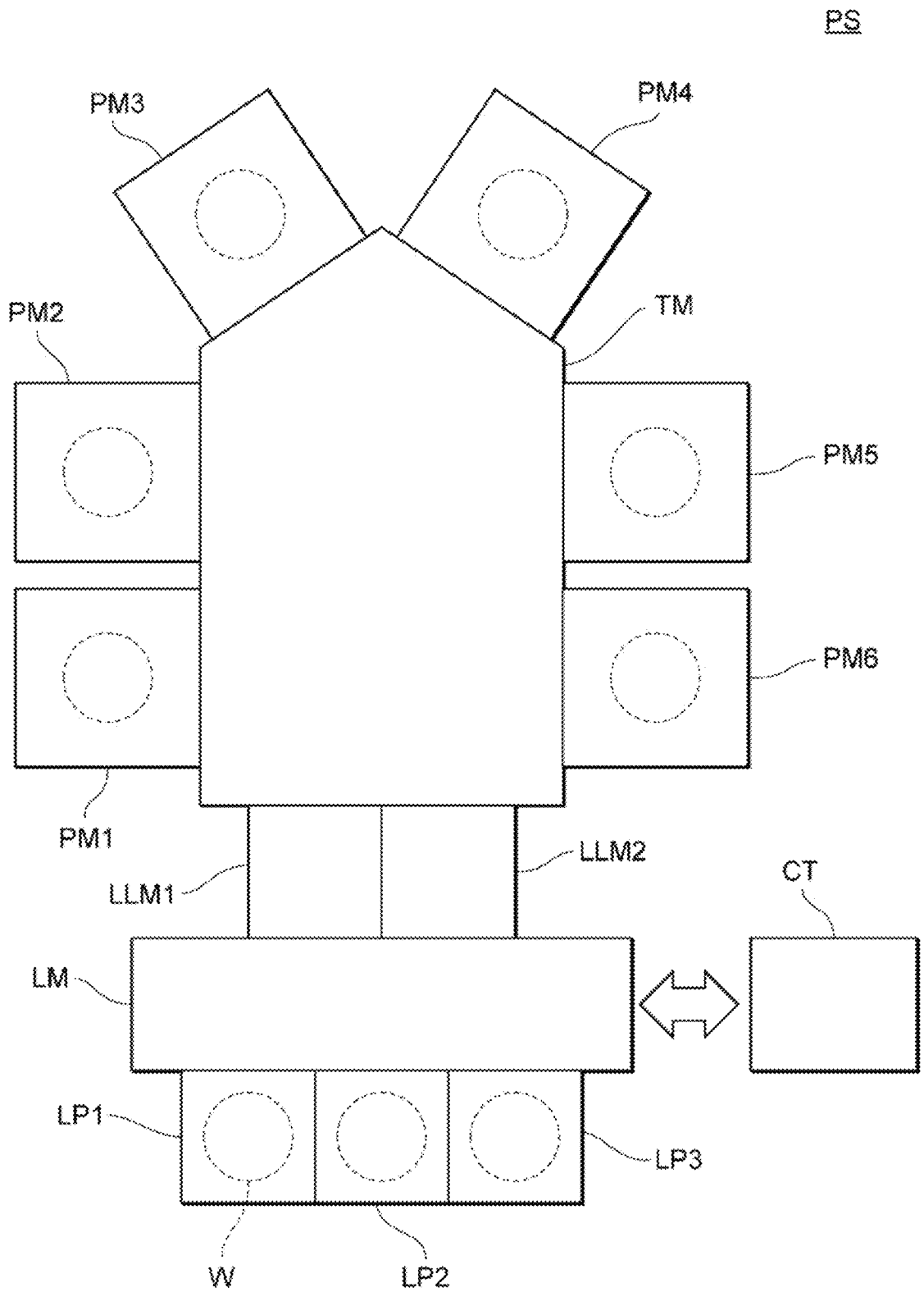
FIG. 2 is a schematic view illustrating a substrate processing system PS according to one embodiment.

FIG. 2 is a schematic view illustrating a substrate processing system PS according to one embodiment. The processing method may be performed using the substrate processing system PS.

The substrate processing system PS includes substrate processing chambers PM1 to PM6 (hereinafter, also collectively referred to as a "substrate processing module PM"), a transfer module TM, load-lock modules LLM1 and LLM2 (hereinafter, also collectively referred to as a "load-lock module LLM"), a loader module LM, and load ports LP1 to LP3 (hereinafter, also collectively referred to as a "load port LP"). The control unit CT controls each component of the substrate processing system PS to perform a predetermined processing on the substrate W.

The substrate processing module PM performs processings such as an etching processing, a trimming processing, a film formation processing, an annealing processing, a doping processing, a lithography processing, a cleaning processing, and an ashing processing on the substrate W inside thereof. A part of the substrate processing module PM may be a measuring module, and may measure a film thickness of a film formed on the substrate W or a dimension of a pattern formed on the substrate W by using, for example, an optical method. The plasma processing apparatus 1 illustrated in FIG. 1 is an example of the substrate processing module PM.

The transfer module TM includes a transfer device that transfers the substrate W, and transfers the substrate W between the substrate processing modules PM or between the substrate processing module PM and the load-lock module LLM. The substrate processing module PM and the load-lock module LLM are disposed adjacent to the transfer module TM. The transfer module TM, the substrate processing module PM, and the load-lock module LLM are spatially isolated or connected with each other by an openable/closable gate valve.

The load-lock modules LLM1 and LLM2 are provided between the transfer module TM and the load module LM. The load-lock module LLM may switch its internal pressure to an atmospheric pressure or a vacuum. The load-lock module LLM transfers the substrate W from the loader module LM at atmospheric pressure to the transfer module TM at vacuum, and transfers it from the transfer module TM at vacuum to the loader module LM at atmospheric pressure.

The loader module LM includes a transfer device that transfers the substrate W, and transfers the substrate W between the load-lock module LLM and the load port LP. Inside the load port LP, for example, a front opening unified pod (FOUP) capable of accommodating 25 substrates W or an empty FOUP may be disposed. The loader module LP takes out the substrate W from the FOUP in the load port LP and transfers it to the load-lock module LLM. Further, the loader module LM takes out the substrate W from the load-lock module LLM and transfers it to the FOUP in the load port LP.

The control unit CT controls each component of the substrate processing system PS to perform a predetermined processing on the substrate W. The control unit CT stores a recipe in which a procedure of the process, a condition of the process, and a condition of the transfer are set, and controls each component of the substrate processing system PS so as to perform a predetermined processing on the substrate W according to the recipe. The control unit CT may have a part of or all of the functions of the control unit 50 of the plasma processing apparatus 1 illustrated in FIG. 1.

[Example of Processing Method]

Figure 3:
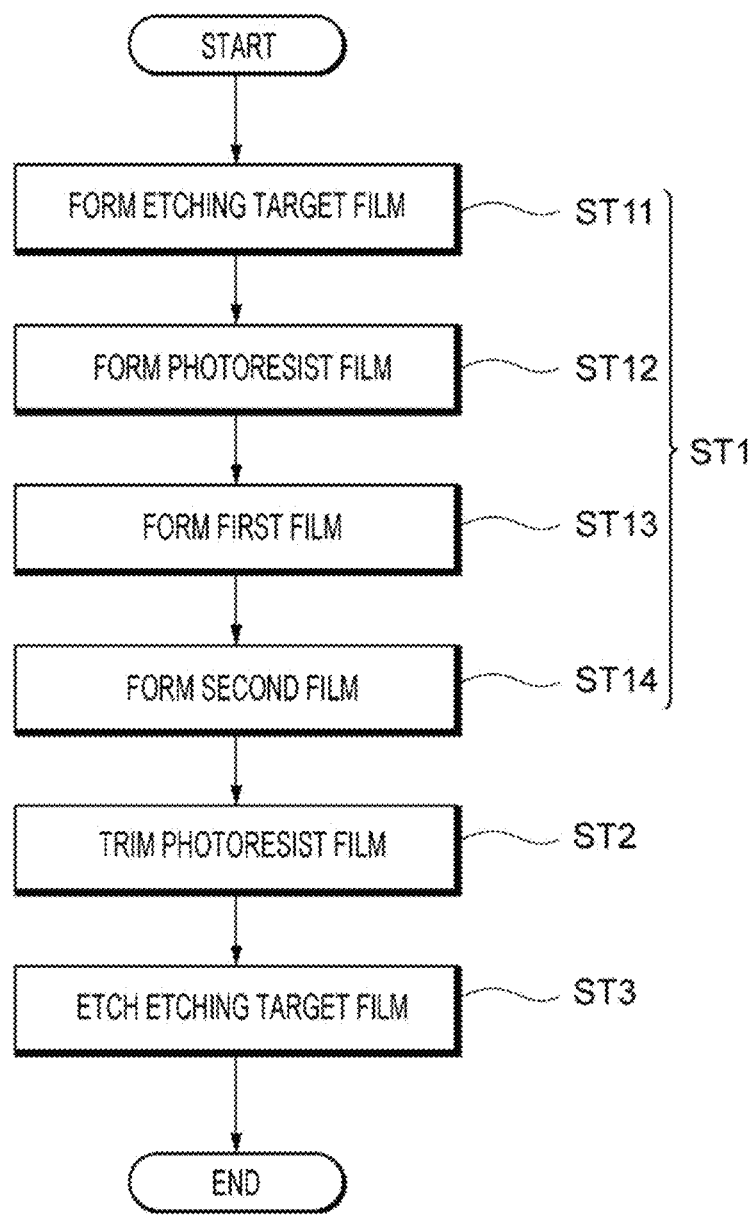
FIG. 3 is a flowchart illustrating an example of the processing method.

FIG. 3 is a flowchart illustrating an example of the processing method. As illustrated in FIG. 3, the processing method includes preparing a substrate (preparing step: step ST1), trimming a photoresist film (trimming step: step ST2), and etching an etching target film (etching step: step ST3). Each step may be performed by an arbitrary substrate processing module PM in the substrate processing system PS. Further, a plurality of steps may be continuously performed in one substrate processing module PM. Further, in step ST1, a substrate on which a patterned resist is formed may be provided. That is, steps ST11 and ST12 may be performed by one or more substrate processing modules PM in the substrate processing system PS, and then, steps ST13 and ST14 may be performed by another substrate processing module PM different from the one or more substrate processing modules. Further, steps ST11 and/or ST12 may be performed outside the substrate processing system PS.

Figure 4A:
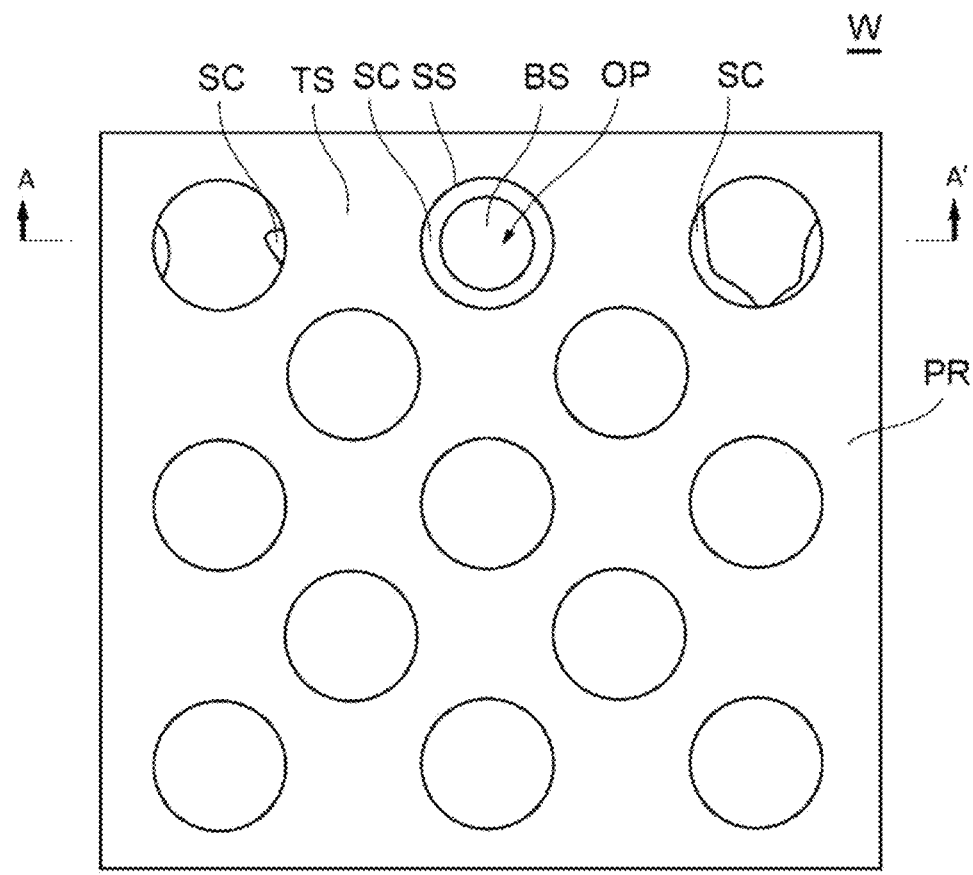
FIG. 4A is a view illustrating an example of a substrate W.
Figure 4B:
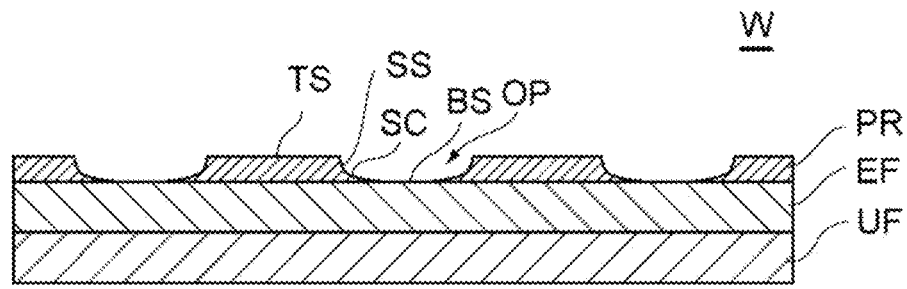
FIG. 4B is a view illustrating an example of the substrate W.

FIGS. 4A and 4B are views illustrating an example of the substrate W. FIG. 4A is a top view of the substrate W. Further, FIG. 4B is a cross-sectional view of the substrate W taken along line AA'. FIGS. 4A and 4B illustrate the substrate W in a part of a preparing step (to be described later). The substrate W has a structure in which an underlying film UF, an etching target film EF, and a photoresist film PR are stacked. A predetermined pattern is formed on the photoresist film PR. As illustrated in FIG. 4A, the photoresist film PR of the example has a pattern in which a plurality of openings OP is repeatedly arranged at a constant interval viewed in a plane view of the substrate W (when viewing the substrate W in a direction from the top to the bottom in FIG. 4B).

FIGS. 5A to 5E are schematic views illustrating an example of the cross-sectional structure of the substrate W along the flow of the processing method. FIGS. 5A, 5B, 5C, 5D, and 5E illustrate the cross-sectional structure of the substrate W after being processed in steps ST11, ST12, ST13, ST14, ST2, and ST3, respectively.

Hereinafter, the example of the processing method illustrated in FIG. 3 will be described with reference to each drawing. The processing in each step may be performed in the substrate processing module PM of the substrate processing system PS (see FIG. 2). The etching processing in each step may be performed in the plasma processing apparatus 1 illustrated in FIG. 1. The processing in one step of the processing method may be performed by one module of the substrate processing module PM, and the processing in another step of the processing method may be performed by another module of the substrate processing module PM. The processing in a plurality of steps of the processing method may be continuously performed in one module of the substrate processing module PM.

In step ST1, the substrate W is prepared. Step ST1 includes forming the etching target film EF (step ST11), forming the photoresist film PR (step ST12), forming a first film TD1 (step ST13), and forming a second film (step ST14).

Figure 5A:
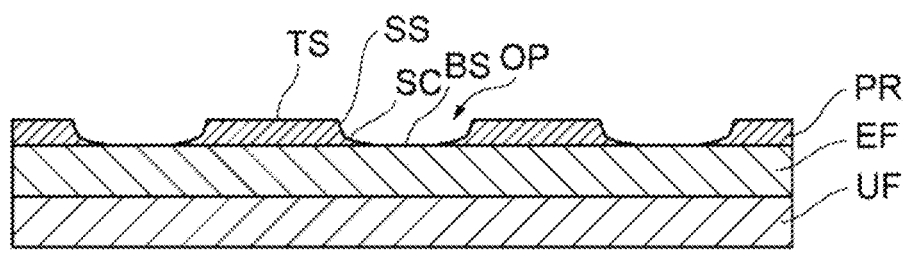
FIG. 5A is a schematic view illustrating an example of a cross-sectional structure of the substrate W along a flow of the processing method.

In step ST11, the etching target film EF is formed on the underlying film UF (FIG. 5A). The underlying film UF is, for example, an organic film such as a spin-on carbon film (SOC) or an amorphous carbon film formed on the silicon wafer (including both a case of being formed on the surface of the silicon wafer and a case of being formed on another film formed on the silicon wafer). The etching target film EF is, for example, a dielectric film such as a silicon oxide film, a silicon nitride film, SiARC, or SiON. The underlying film UF and/or the etching target film EF may be formed by a CVD method, an ALD method, or a spin-coat method. The underlying film UF and/or the etching target film EF may be a flat film, or a film having irregularities.

In step ST12, the photoresist film PR is formed on the etching target film EF (see FIG. 5A). The photoresist film PR includes an upper surface TS, a side surface SS continuous from the upper surface TS, and a lower surface in contact with the etching target film EF. Further, the photoresist film PR includes at least one opening OP. The opening OP is defined by the side surface SS of the photoresist film PR. The opening OP is a space on the etching target film EF surrounded by the side surface SS. That is, in FIG. 5A, the upper surface of the etching target film EF includes a portion covered by the photoresist film PR, and a portion exposed on a bottom surface BS of the opening OP.

The side surface SS of the photoresist film PR includes a portion SC protruding from the side surface SS to the opening OP. The portion SC is, for example, a portion protruding from the side surface SS, which extends from the side surface SS of the photoresist film PR to at least a part of the upper surface of the etching target film EF. The portion SC may be, for example, a scum of the photoresist film PR that exists around or in the vicinity of the bottom surface BS of the opening OP. The scum is, for example, the residue of the resist that is not completely removed in the process of forming the opening OP in the photoresist film PR (e.g., development process). Further, the portion SC may be a protrusion that protrudes from the upper side surface SS toward the opening OP in a region of the side surface SS away from the bottom surface BS. The protrusion is a portion protruding to the opening OP from around or in the vicinity of the side surface SS. The protrusion may be a scum of the photoresist film PR. The side surface SS may include dents or cracks (including breaks in patterns such as line patterns).

The opening OP may have an arbitrary shape when viewing the substrate W in a plane view (when viewing the substrate W in a direction from the top to the bottom in FIG. 5A). The shape may be, for example, a circle, an ellipse, a rectangle, a line or a shape in which one or more of these are combined. The photoresist film PR may have a plurality of openings OP. As illustrated in FIG. 4A, the plurality of openings OP may each have a hole shape, and may form an array pattern in which the openings are arranged in a constant interval. Further, the plurality of openings OP may each have a line shape, and may form a side-by-side line and space pattern at a constant interval.

Two or more of the photoresist film PR, the etching target film EF, and the underlying film UF may function as a multi-layer resist. For example, the substrate W may include another film under the underlying film UF, and the another film may be etched using the stacked film of the photoresist film PR, the etching target film EF, and the underlying film UF as a multi-layer resist. The multi-layer resist film may include, for example, an organic film, or another dielectric film or an inorganic film. The organic film is, for example, a spin-on carbon film (SOC) or an amorphous carbon. The dielectric film is, for example, a silicon oxide film, a silicon nitride film, SiARC, or SiON. In the photoresist film PR, a metal containing film MF may be a film containing at least one metal selected from the group consisting of tin (Sn), hafnium (Hf), indium (In), titanium (Ti), and zirconium (Zr), and may be a Sn-containing film as an example. The photoresist film PR may be formed by a vapor phase deposition method such as a CVD method, an MLD method, or an ALD method, or may be formed by a liquid phase deposition method such as a spin-coat method. The opening OP may be formed by lithography in the photoresist film PR, or may be formed by etching the photoresist film PR. As an example, first, a photoresist film containing a metal such as tin is formed on the etching target film EF. Then, the photoresist film is selectively irradiated with light (e.g., EUV excimer laser) using an exposure mask, so as to expose the photoresist film with a pattern having a shape according to the exposure mask. Before the exposure, a pre-exposure bake for removing the solvent from the photoresist film may be executed, and after the exposure, a post-exposure bake for curing the photoresist film may be executed. Then, the photoresist film after the exposure is developed. The development may be executed by dry development using, for example, heat or plasma, or by wet development using a developer. For example, when developing using plasma, the resist film after the exposure may be exposed to plasma generated from a gas containing a halogen compound such as hydrogen fluoride. As described above, the photoresist film PR including the opening OP may be formed.

Figure 5B:
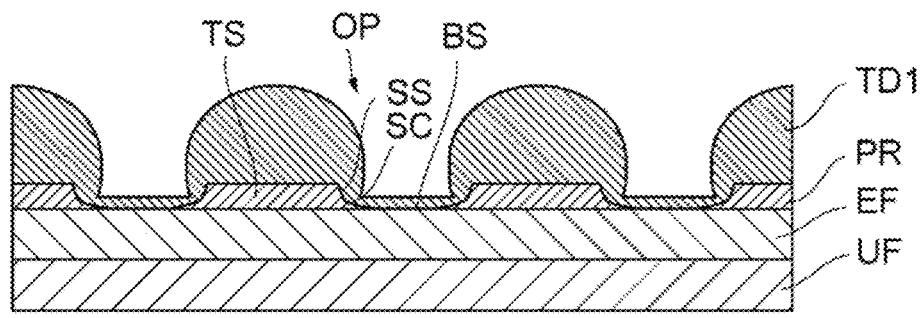
FIG. 5B is a schematic view illustrating the example of the cross-sectional structure of the substrate W along the flow of the processing method.

In step ST13, the first film TD1 is formed (see FIG. 5B). The first film TD1 is formed to include at least a portion formed on the upper surface TS of the photoresist film PR, and a portion formed on the side surface SS of the photoresist film PR. Further, the first film TD1 may be formed on the etching target film EF exposed to the bottom surface BS of the opening OP. In the first film TD1, a film thickness of the portion formed on the upper surface TS may be larger than a film thickness of the portion formed on the side surface SS and a film thickness of the portion formed on the bottom surface BS. Further, in the first film TD1, the surface of the portion formed on the side surface SS may have surface roughness (including the number of or the size of irregularities) lower than that of the side surface SS of the photoresist film PR.

Further, in the first film TD1, the portion formed on the upper surface TS of the photoresist film PR may be formed to protrude from the upper surface TS to the opening OP when viewing the substrate W in a plane view. The portion is formed, for example, to be overlapped with a part of or the entire portion SC when viewing the substrate W in a plane view. Further, the surface of the portion may be a curved surface, or a flat surface.

The first film TD1 is, for example, an organic film. The first film TD1 is formed by, for example, a PECVD using plasma generated from a processing gas containing a hydrocarbon ($C_xH_y$)-based gas (x and y are positive numbers). The processing gas may be a gas containing $C_tH_uF_v$-based gas (t and v are positive numbers, u is a number of 0 or more). As an example, the processing gas may be a gas containing $CH_3F$ or $C_4F_6$. Further, the processing gas may contain an inert gas such as $N_2$. By adjusting a film formation condition, the first film TD1 is formed such that a film thickness of the upper surface TS is larger than a film thickness of the side surface SS and the bottom surface BS. The first film TD1 may be, for example, an inorganic film such as a Si-containing film.

Figure 5C:
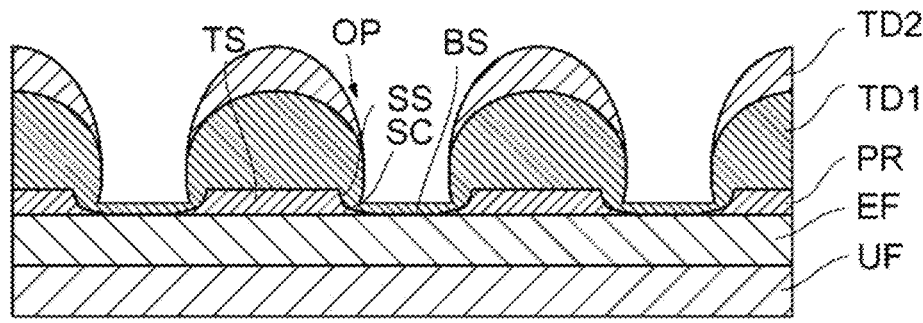
FIG. 5C is a schematic view illustrating the example of the cross-sectional structure of the substrate W along the flow of the processing method.

In step ST14, the second film TD2 is formed (see FIG. 5C). The second film TD2 is formed at least on a portion of the first film TD1 formed on the upper surface TS. The second film TD2 may be selectively formed on a portion of the first film TD1 formed on the upper surface TS. Further, the second film TD2 may be further formed on a portion of the first film TD1 formed on the side surface SS and the bottom surface BS. The surface of the portion may be a curved surface, or a flat surface.

The second film TD2 is, for example, an inorganic film such as a Si-containing film. The second film TD2 is formed by a PECVD using plasma generated from a gas containing Si. By adjusting a film formation condition, the second film TD2 may be selectively formed on a portion of the first film TD1 formed on the upper surface TS. Further, as an example, the second film TD2 may be a non-metal inorganic film containing boron, phosphorus, or sulfur, or a metal film containing tin, tungsten, titanium, or aluminum.

Figure 5D:
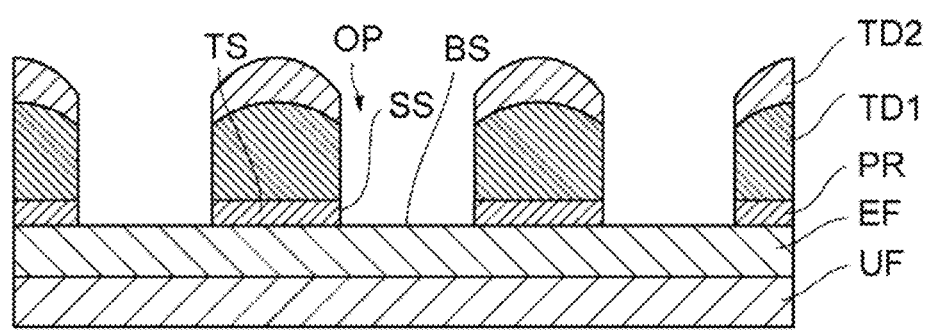
FIG. 5D is a schematic view illustrating the example of the cross-sectional structure of the substrate W along the flow of the processing method.

In step ST2, the portion SC of the photoresist film PR is trimmed (see FIG. 5D). The trimming of the portion SC may be executed by anisotropically etching a part of the first film TD1, a part of the second film TD2, and the part SC of the photoresist film PR using plasma generated from one or more processing gases. Further, a part of the first film TD1 and a part of the second film TD2 may be anisotropically etched and isotropically etched. The one or more processing gases are one or more processing gases that cause an etching rate of the photoresist film PR and/or the first film TD1 with respect to the plasma to be larger than an etching rate of the second film TD2 with respect to the plasma. For example, when the first film TD1 is an organic film and the second film TD2 is a Si-containing film, the one or more gases may contain an oxygen-containing gas and a halogen-containing gas.

In step ST2, a predetermined film may be further formed at least on the side surface SS of the photoresist film PR after trimming the photoresist film PR. Then, the photoresist film PR in which the predetermined film is formed on the side surface SS may be further trimmed. Therefore, even when the thickness of the first film TD1 and/or the second film TD2 is not sufficient, the photoresist film PR may be appropriately trimmed. In an example, after trimming the photoresist film PR in step ST2, the dimension (diameter) of the opening OP formed in the photoresist film PR may be measured, and a predetermined film may be formed at least on the side surface SS of the photoresist film PR based on the measured dimension. The predetermined film may be formed in a side wall of the first film TD1 and/or a side wall of the second film TD2 that define the opening OP. Further, the predetermined film may be formed on the upper surface of the second film TD2. The predetermined film may be formed of the same material as the first film TD1 or the same material as the second film TD2. Further, the predetermined film may be a stacked film of a film formed of the same material as the first film TD1 and a film formed of the same material as the second film TD2. A film thickness of the predetermined film may be set based on the dimension (diameter) of the opening OP formed in the photoresist film PR.

The dimension of the opening OP may be measured by an optical measuring device. The measuring device may be one of the substrate processing modules PM illustrated in FIG. 2. As an example, when a plurality of substrates W (e.g., 25 substrates) is processed as one unit (hereinafter, also referred to as a "lot") in the processing method, the dimension of the opening OP may be measured for each substrate included in the lot. Further, the dimension of the opening OP is measured for a specific substrate included in one lot, and the measured value may be assumed as a dimension of the opening in the specific substrate and in another substrate included in one lot. The substrate to be measured of a plurality of substrates included in one lot may be (a) the substrate on which the processing method is first performed, (b) the substrate on which the processing method is performed last, or (c) any one of the substrates on which the processing method is performed except the first one and the last one in the lot.

Figure 5E:
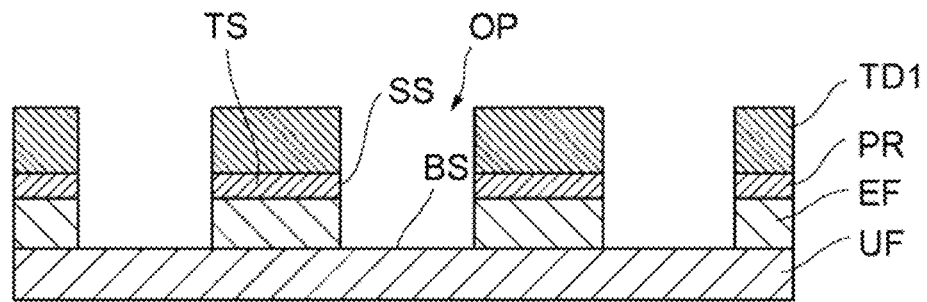
FIG. 5E is a schematic view illustrating the example of the cross-sectional structure of the substrate W along the flow of the processing method.

In step ST3, the etching target film EF is etched (see FIG. 5E). The etching target film EF is anisotropically etched using the photoresist film PR, the first film TD1, and the second film TD2 as a mask. That is, the etching target film EF is anisotropically etched in a depth direction of the opening OP from the exposed portion in the bottom surface BS of the opening OP.

The etching target film EF may be etched by a method in which the etching target film EF is selectively etched with respect to the first film TD1 and the photoresist film PR. When the etching target film EF is a Si-containing film such as a silicon oxide film, a silicon nitride film, or SiON, the processing gas used when etching the etching target film EF may be a fluorocarbon gas and/or a hydro-fluorocarbon gas.

Next, Example and Reference Example of the processing method will be described. The present disclosure is not limited to the following Example.

Example

The substrate W in Example includes a structure in which an organic film (first film TD1) and a Si-containing film (second film TD2) are stacked in this order on a stacked structure of a SOC film (underlying film UF), a SiON film (etching target film EF), and a photoresist film (photoresist film PR) (see FIG. 5C). The opening pattern of the photoresist film is a hole pattern illustrated in FIG. 4A, similarly to Reference Example.

In Example, the organic film (first film TD1) is formed by a PECVD using a mixed gas of $CH_4$ and Ar. Further, the Si-containing film (second film TD2) is formed by a PECVD using a mixed gas of $SiCl_4$, $H_2$, and Ar. Then, after forming the organic film and the Si-containing film, a part of the organic film, a part of the organic film, a part of the Si-containing film, and a part of the photoresist film are etched by plasma etching using a mixed gas of $O_2$, HBr, and Ar. Then, the SiON film is etched using the organic film, the Si-containing film, and the photoresist film as a mask. The SiON film is etched by plasma generated from a mixed gas of a CHF-based gas, $NF_3$, $N_2$, and Ar.

Reference Example

Similarly to Example, the substrate W in Reference Example has a structure in which a SOC film (underlying film UF), a SiON film (etching target film EF), and a photoresist film (photoresist film PR) are stacked in this order (see FIG. 5A). The opening pattern of the photoresist film is a hole pattern illustrated in FIG. 4A. In Reference Example, after forming the opening pattern in the photoresist film, the SiON film is etched using the photoresist film as a mask. The SiON film is etched by plasma generated from a mixed gas of a CHF-based gas, $NF_3$, $N_2$, and Ar.

Measurement results of a critical dimension (CD: dimension) and a local critical dimension uniformity (LCDU: $3\sigma$ of CD) of the opening OP in Example and Reference Example are illustrated in Table 1. In Table 1, the "photoresist film" is the measurement result of the opening formed in the photoresist film. Further, the "SiON film" is the measurement result of the opening formed in the SiON film. Further, CD is an average value.

TABLE 1

| | Photoresist Film | Reference Example SiON Film | Example SiON Film |
|---|---|---|---|
| CD (nm) | 23.00 | 19.60 | 22.90 |
| LCDU (nm) | 3.94 | 2.53 | 1.28 |
| LCDU/CD | 0.171 | 0.129 | 0.056 |

As illustrated in Table 1, the measurement results in Example are better than the measurement results in Reference Example. That is, first, the LCDU of the opening in the SiON film of Example is significantly improved as compared with the LCDU of the opening in the SiON film of Reference Example. That is, in Example, the uniformity of the CD of the opening in the SiON film may be significantly improved. Further, in Example, the CD of the SiON film is similar to the CD of the photoresist film. The CD of the SiON film of Reference Example has a considerably smaller value than the CD of the photoresist film. However, similarly to the value obtained by multiplying the LCDU of the SiON film by the CD, the significant improvement is seen in Example as compared with Reference Example.

In the processing method, the first film TD1 is formed on the photoresist film PR, and the second film TD2 is further formed on the first film TD1. As a result, the portion SC that exists in the side surface SS that defines the opening of the photoresist film PR may be selectively removed or reduced. Further, even when dents or cracks (including breaks in patterns such as line patterns) exist in the side surface SS that defines the opening of the photoresist film PR, the dents or the like may be supplemented or reduced by forming the first film TD1 on the photoresist film PR. Therefore, since the surface roughness of the side surface SS that defines the opening OP of the photoresist film PR may be reduced, the dimension or the shape of the opening OP may be appropriately controlled. Then, in the processing method, since the etching target film EF is etched using the photoresist film PR (and/or the first film TD1 and/or the second film TD2) as a mask, the dimension or the shape of the opening formed in the etching target film EF may be appropriately controlled.

Further, in the processing method, the first film TD1 and the second film TD2 are selectively formed on the photoresist film PR. That is, in the processing method, the first film TD1 and the second film TD2 are formed such that the film thickness of the portion formed on the upper surface TS of the photoresist film PR is larger than the film thickness of the portion formed on the side surface SS. Therefore, even when the film thickness of the photoresist film PR is thin, the etching target film EF may be etched with a sufficient selectivity between the etching target film EF and the etching mask (photoresist film PR and first film TD1 and second film TD2).

[Modification 1 of Processing Method]

Figure 6:
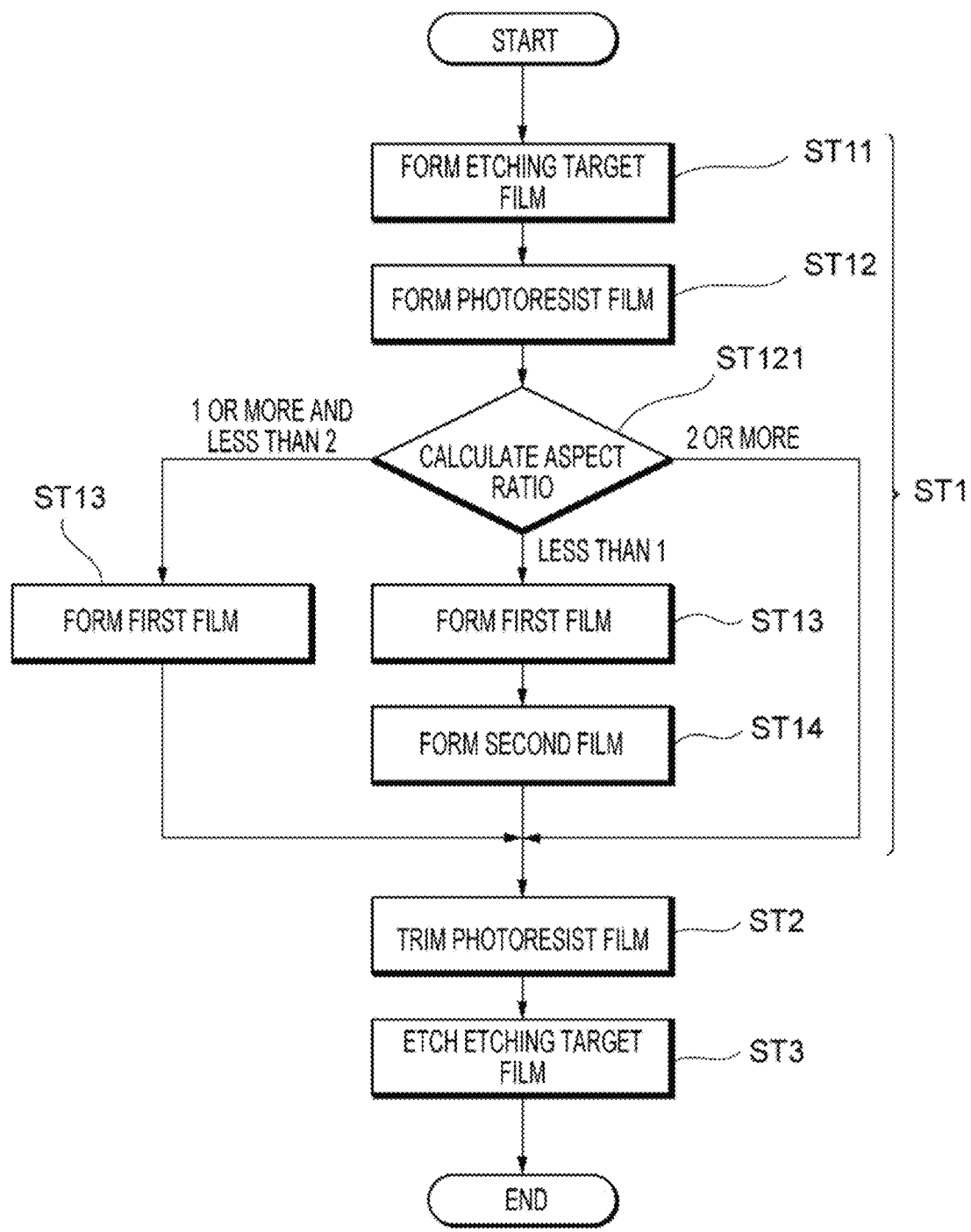
FIG. 6 is a flowchart illustrating Modification of the processing method.

FIG. 6 is a flowchart illustrating Modification of the processing method. This Modification is different from the example illustrated in FIG. 3 in that preparing step ST1 further includes step ST121 in which the film thickness of the photoresist film PR is determined. That is, in this Modification, based on the film thickness of the photoresist film PR formed in step ST12, remaining steps in preparing step ST1 are different.

After the photoresist film PR is formed in step ST12, in step ST121, the dimension of the opening OP (as an example, diameter of the opening OP) formed in the photoresist film PR and the thickness of the photoresist film PR are measured. Then, the ratio of the film thickness of the photoresist film PR to the dimension of the opening OP (hereinafter, also referred to as an "aspect ratio") is calculated. When the aspect ratio is 2 or more, steps ST13 and ST14 are skipped, and preparing step ST1 is ended. Then, the portion SC of the photoresist film PR is trimmed in step ST2. The trimming is executed by, for example, anisotropically etching the photoresist film PR. A first thickness may be arbitrarily determined based on the thickness or the material of the etching target film EF, or the type of the processing gas used for etching the etching target film EF.

When the aspect ratio is 1 or more and less than 2, similarly to FIG. 3, in step ST13, the first film TD1 is formed on the photoresist film PR. Then, step ST14 is skipped, and preparing step ST1 is ended. Then, the portion SC of the photoresist film PR is trimmed in step ST2. A second thickness may be arbitrarily determined based on the thickness or the material of the first film TD1, the thickness or the material of the etching target film EF, or the type of the processing gas used for etching the etching target film EF.

When the aspect ratio is less than 1, steps ST13 and ST14 are executed and preparing step ST1 is ended as in FIG. 3. Then, as in FIG. 3, the portion SC of the photoresist film PR is trimmed in step ST2.

In step ST121, the dimension of the opening OP and the film thickness of the photoresist film PR may be measured by an optical measuring device. The measuring device may be one of the substrate processing modules PM illustrated in FIG. 2. As an example, when a plurality of substrates W (e.g., 25 substrates) is processed as one unit (hereinafter, referred to as a "lot") in the processing method, the dimension of the opening OP and/or the film thickness of the photoresist film PR may be measured for each substrate included in the lot. Further, in step ST121, the dimension of the opening OP and/or the film thickness of the photoresist film PR may be measured for a specific substrate included in one lot, and the aspect ratio calculated from the measurement values may be assumed as an aspect ratio of the specific substrate and an aspect ratio of other substrates included in one lot. The substrate to be measured of a plurality of substrates included in one lot may be (a) the substrate on which the processing method is first performed, (b) the substrate on which the processing method is performed last, or (c) any one of the substrates on which the processing method is performed except the first one and the last one in the lot.

According to this Modification, preparing step may be appropriately selected based on the film thickness of the photoresist film.

[Modification 2 of Processing Method]

Figure 7:
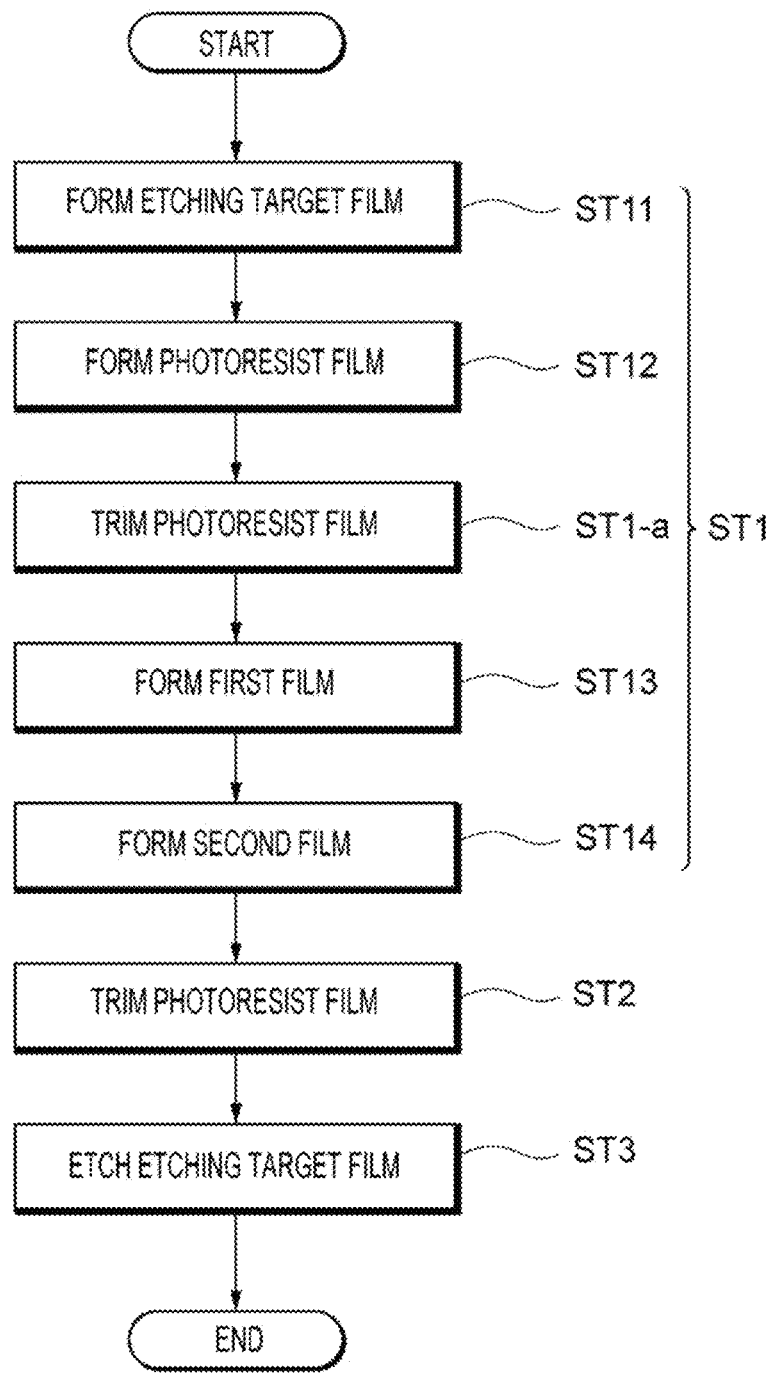
FIG. 7 is a flowchart illustrating Modification of the processing method.
Figure 8:
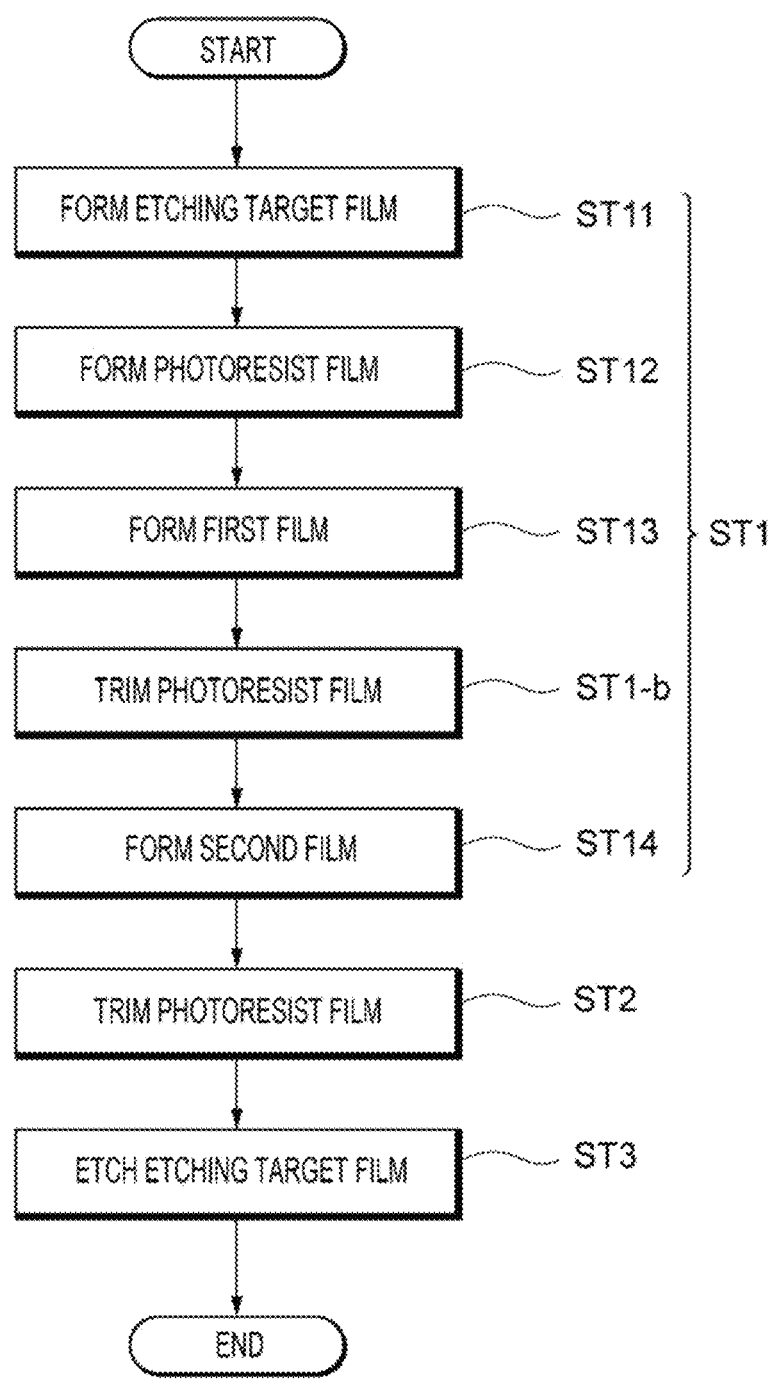
FIG. 8 is a flowchart illustrating Modification of the processing method.
Figure 9:
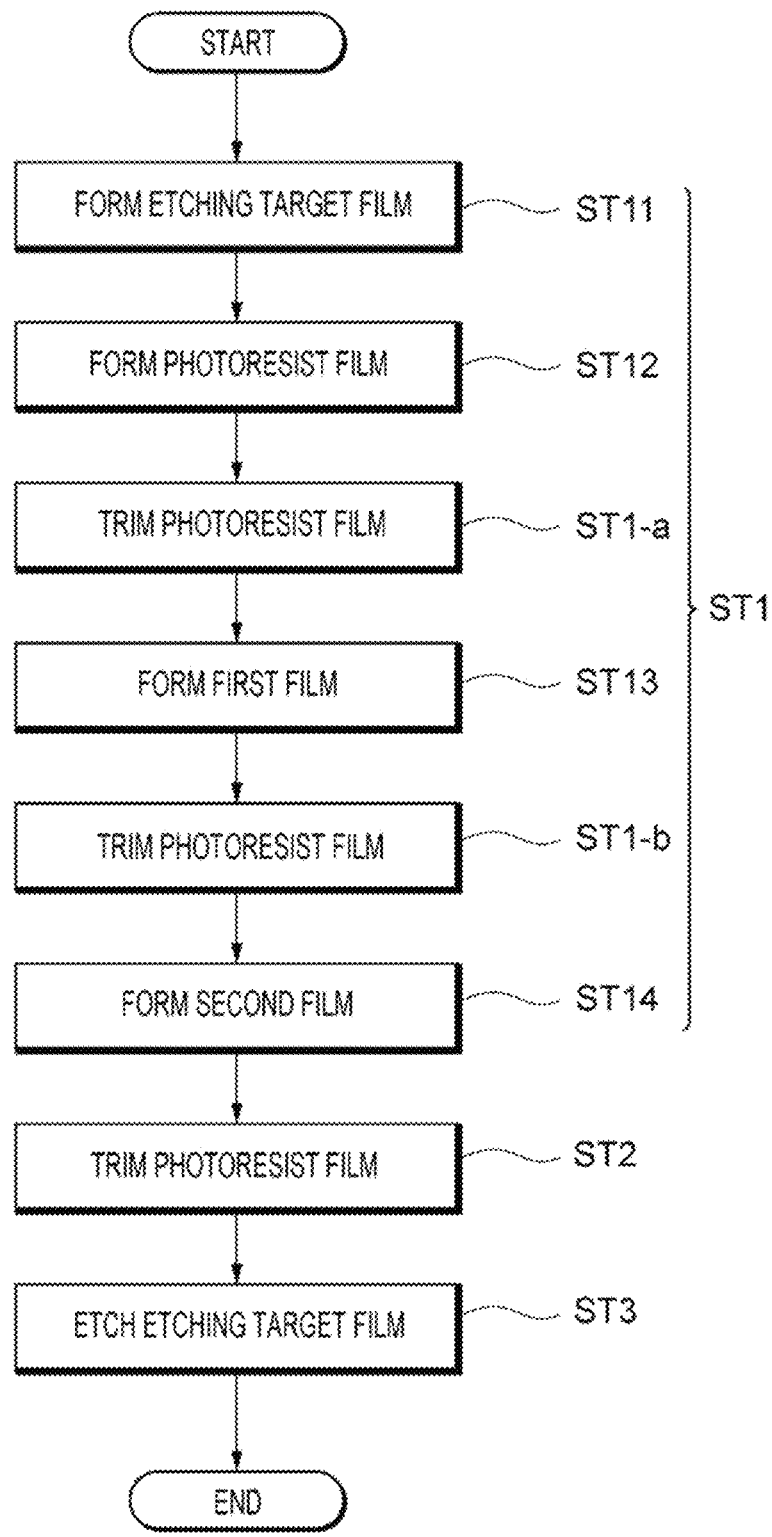
FIG. 9 is a flowchart illustrating Modification of the processing method.

FIGS. 7 to 9 are flowcharts illustrating Modifications of the processing method. These Modifications are different from the example illustrated in FIG. 3 in that, in addition to step ST2, steps ST1-*a* and ST1-*b*, in which at least a part of the side surface of the photoresist film PR is trimmed, are included in at least one of the cases between step ST12 and step ST13 and between step ST13 and step ST14. More specifically, in Modification illustrated in FIG. 7, step ST1-*a* in which the portion SC of the photoresist film PR is trimmed using plasma generated from one or more processing gases is included between step ST12 and step ST13. In Modification illustrated in FIG. 8, step ST1-*b* in which a part of the first film TD1 (e.g., at least a part of a second portion of the first film TD1) and the portion SC of the photoresist film PR are trimmed using plasma generated from one or more processing gases is included between step ST13 and step ST14. In Modification illustrated in FIG. 9, step ST1-*a* in which the portion SC of the photoresist film PR is trimmed using plasma generated from one or more processing gases is included between step ST12 and step ST13, and step ST1-*b* in which a part of the first film TD1 (e.g., at least a part of the second portion of the first film TD1) is trimmed using plasma generated from one or more processing gases is included between step ST13 and step ST14. In Modification in FIG. 9, a part of the portion SC of the photoresist film PR may be trimmed in step ST1-*a*, and a part of the first film TD1 and the remaining portion of the photoresist film PR may be trimmed in step ST1-*b*.

According to this Modification, the portion SC that exists in the side surface SS that defines the opening of the photoresist film PR may be selectively removed or reduced with higher accuracy.

Further, the present disclosure includes the following embodiments.

APPENDIX 1

A plasma processing method including: providing a substrate including: (a) an etching target film; (b) a photoresist film on an upper surface of the etching target film, having a side surface that defines at least one opening in the upper surface of the etching target film; and (c) a first film including a first portion on an upper surface of the photoresist film and second portion on the side surface of the photoresist film, the first portion having a film thickness larger than that of the second portion; and trimming at least a part of the side surface of the photoresist film and at least a part of the second portion of the first film are etched.

APPENDIX 2

The plasma processing method according to Appendix 1, in which the providing the substrate includes forming a second film at least on the first portion of the first film.

APPENDIX 3

The plasma processing method according to Appendix 1 or 2, further including:

forming a first film on the trimmed photoresist film.

APPENDIX 4

The plasma processing method according to Appendix 2 or 3, further including:

after the trimming, etching the etching target film using the photoresist film, the first film, and the second film as a mask.

APPENDIX 5

The plasma processing method according to any one of Appendixes 1 to 4, in which the side surface of the photoresist film includes at least one of a recess and a protrusion protruding from the side surface to the opening.

APPENDIX 6

The plasma processing method according to Appendix 5, in which the protrusion extends from the side surface of the photoresist film to the upper surface of the etching target film.

APPENDIX 7

The plasma processing method according to Appendix 2, in which the first film is an organic film, and the second film is an inorganic film.

APPENDIX 8

The plasma processing method according to any one of Appendixes 1 to 7, in which the photoresist film is a Sn-containing film.

APPENDIX 9

The plasma processing method according to Appendix 7, in which the inorganic film is a metal-containing film or a Si-containing film.

APPENDIX 10

The plasma processing method according to Appendix 9, in which the metal-containing film is a Sn-containing film.

APPENDIX 11

The plasma processing method according to Appendix 9, in which the metal-containing film is a W-containing film, a Ti-containing film, or an Al-containing film.

APPENDIX 12

The plasma processing method according to Appendix 7, in which the inorganic film is a non-metal inorganic film containing boron, phosphorus, or sulfur.

APPENDIX 13

The plasma processing method according to any one of Appendixes 1 to 7, in which the trimming is performed using plasma generated from a predetermined processing gas, and
an etching rate of the first film with respect to the plasma is larger than an etching rate of the second film with respect to the plasma.

APPENDIX 14

The plasma processing method according to Appendix 13, in which the predetermined processing gas contains an oxygen-containing gas and a halogen-containing gas.

APPENDIX 15

The plasma processing method according to any one of Appendixes 2, 4, and 7, in which the first film and the second film are formed by a plasma CVD.

APPENDIX 16

The plasma processing method according to Appendix 15, in which the first film is formed using plasma generated from a gas containing a carbon-containing gas, and
the second film is formed using plasma generated from a gas containing a Si-containing gas.

APPENDIX 17

The plasma processing method according to Appendix 16, in which the carbon-containing gas is $C_xH_y$ (x and y are integers of 1 or more), $C_tH_uF_v$ (t and v are integers of 1 or more and u is an integer of 0 or more), CO, or $CO_2$.

APPENDIX 18

The plasma processing method according to any one of Appendixes 2, 4, and 7 to 12, in which the film thickness of the first portion of the first film is larger than a film thickness of the photoresist film and the film thickness of the second film.

APPENDIX 19

The plasma processing method according to Appendix 4, in which the etching etches the etching target film and the second film.

APPENDIX 20

The plasma processing method according to Appendix 19, in which the etching target film is a Si-containing film, and the second film is a Si-containing film.

APPENDIX 21

The plasma processing method according to Appendix 4, 19, or 20, in which the trimming and the etching are performed in a same chamber.

APPENDIX 22

The plasma processing method according to any one of Appendixes 1 to 21, in which the trimming includes:
measuring a dimension of the opening defined on the etching target film by the side surface trimmed in the trimming;
forming a third film on the side surface trimmed in the trimming based on the measured dimension; and
etching a part of the third film.

APPENDIX 23

The plasma processing method according to Appendix 22, in which the third film includes an organic film.

APPENDIX 24

The plasma processing method according to Appendix 23, in which the third film is a stacked film including the organic film and an inorganic film on the organic film.

APPENDIX 25

The plasma processing method according to Appendixes 22 to 24, in which the trimming further includes repeating the measuring of the dimension of the opening, the forming of the third film, and the etching of a part of the third film.

APPENDIX 26

A plasma processing apparatus including: a plasma processing chamber; a gas supply unit that supplies a processing gas to the plasma processing chamber; a power supply that supplies power to the plasma processing chamber to generate plasma in the plasma processing chamber; and a control unit, in which the control unit is configured to cause:

disposing a substrate including: (a) an etching target film; (b) a photoresist film on an upper surface of the etching target film, having a side surface that defines at least one opening in the upper surface of the etching target film; (c) a first film at least including a first portion on an upper surface of the photoresist film and a second portion on the side surface of the photoresist film, the first portion having a film thickness larger than that of the second portion; and (d) a second film at least on the first portion of the first film, and trimming at least a part of the side surface of the photoresist film and at least a part of the second portion of the first film.

APPENDIX 27

A plasma processing system including a first plasma processing apparatus including a first chamber and a second plasma processing apparatus including a second chamber, in which the first plasma processing apparatus is configured to dispose a substrate including (a) an etching target film, and (b) a photoresist film on an upper surface of the etching target film, having a side surface that defines at least one opening in the upper surface of the etching target film in the first chamber, and in the first chamber, forms (c) a first film at least including a first portion on an upper surface of the photoresist film and a second portion on the side surface of the photoresist film, the first portion having a film thickness larger than that of the second portion; and forms (d) a second film at least on the first portion of the first film, and the second plasma processing apparatus is configured to etch at least a part of the side surface of the photoresist film and at least a part of the second portion of the first film.

APPENDIX 28

A plasma processing method including:

providing a substrate including (a) an etching target film, and (b) a photoresist film on an upper surface of the etching target film, having a side surface that defines at least one opening in the upper surface of the etching target film;

obtaining a ratio of a film thickness of the photoresist film with respect to a dimension of the opening;

when the ratio is 1 or more and less than 2, forming a first film on the photoresist film;

when the ratio is less than 1, forming the first film on the photoresist film, and forming a second film on the first film; and trimming at least a part of the side surface of the photoresist film, in which the first film (c) includes a first portion on an upper surface of the photoresist film and a second portion on the side surface of the photoresist film, in which a film thickness of the first portion is larger than that of the second portion, and the second film (d) is formed at least on the first portion of the first film.

According to one embodiment of the present disclosure, it is possible to provide a plasma processing method, a plasma processing apparatus, and a plasma processing system capable of controlling a dimension of an opening.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:

providing a substrate including: an etching target film; a photoresist film on an upper surface of the etching target film, having a side surface that defines at least one opening in the upper surface of the etching target film; and a first film including a first portion on an upper surface of the photoresist film and second portion on the side surface of the photoresist film, the first portion having a film thickness larger than that of the second portion;

forming the first film before the etching target film is etched; and trimming at least a part of the side surface of the photoresist film and at least a part of the second portion of the first film, wherein at least a part of the side surface of the photoresist film and at least a part of the second portion of the first film are etched while leaving the first portion.

2. The plasma processing method according to claim 1, wherein the providing the substrate includes forming a second film at least on the first portion of the first film.

3. The plasma processing method according to claim 1, further comprising:

forming a first film on the trimmed photoresist film.

4. The plasma processing method according to claim 2, further comprising:

after the trimming, etching the etching target film using the photoresist film, the first film, and the second film as a mask.

5. The plasma processing method according to claim 1, wherein the side surface of the photoresist film includes at least one of a recess and a protrusion protruding from the side surface to the opening.

6. The plasma processing method according to claim 5, wherein the protrusion extends from the side surface of the photoresist film to the upper surface of the etching target film.

7. The plasma processing method according to claim 2, wherein the first film is an organic film, and the second film is an inorganic film.

8. The plasma processing method according to claim 1, wherein the photoresist film is a Sn-containing film.

9. The plasma processing method according to claim 7, wherein the inorganic film is a metal-containing film or a Si-containing film.

10. The plasma processing method according to claim 9, wherein the metal-containing film is a Sn-containing film.

11. The plasma processing method according to claim 9, wherein the metal-containing film is a W-containing film, a Ti-containing film, or an Al-containing film.

12. The plasma processing method according to claim 7, wherein the inorganic film is a non-metal inorganic film containing boron, phosphorus, or sulfur.

13. The plasma processing method according to claim 2, wherein the trimming is performed using plasma generated from a predetermined processing gas, and an etching rate of the first film with respect to the plasma is larger than an etching rate of the second film with respect to the plasma.

14. The plasma processing method according to claim 13, wherein the predetermined processing gas contains an oxygen-containing gas and a halogen-containing gas.

15. The plasma processing method according to claim 2, wherein the first film and the second film are formed by a plasma CVD.

16. The plasma processing method according to claim 15, wherein the first film is formed using plasma generated from a gas containing a carbon-containing gas, and the second film is formed using plasma generated from a gas containing a Si-containing gas.

17. The plasma processing method according to claim 16, wherein the carbon-containing gas is $C_xH_y$ (x and y are integers of 1 or more), $C_tH_uF_v$ (t and v are integers of 1 or more, and u is an integer of 0 or more), CO, or $CO_2$.

18. The plasma processing method according to claim 2, wherein the film thickness of the first portion of the first film is larger than a film thickness of the photoresist film and the film thickness of the second film.

19. The plasma processing method according to claim 4, wherein the etching etches the etching target film and the second film.

20. The plasma processing method according to claim 19, wherein the etching target film is a Si-containing film, and the second film is a Si-containing film.

21. The plasma processing method according to claim 4, wherein the trimming and the etching are performed in a same chamber.

22. The plasma processing method according to claim 1, wherein, the trimming includes:

measuring a dimension of the opening defined on the etching target film by the side surface trimmed in the trimming;

forming a third film on the side surface trimmed in the trimming based on the measured dimension; and etching a part of the third film.

23. The plasma processing method according to claim 22, wherein the third film contains an organic film.

24. The plasma processing method according to claim 23, wherein the third film is a stacked film including the organic film and an inorganic film on the organic film.

25. The plasma processing method according to claim 22, wherein the trimming further includes repeating the measuring of the dimension of the opening, the forming of the third film, and the etching of a part of the third film.

26. A plasma processing method comprising:

providing a substrate including an etching target film, and a photoresist film on an upper surface of the etching target film, having a side surface that defines at least one opening in the upper surface of the etching target film;

obtaining a ratio of a film thickness of the photoresist film with respect to a dimension of the opening;

when the ratio is 1 or more and less than 2, forming a first film on the photoresist film;

when the ratio is less than 1, forming the first film on the photoresist film, and forming a second film on the first film, wherein the first film is formed before the etching target film is etched; and trimming at least a part of the side surface of the photoresist film, wherein the first film includes a first portion on an upper surface of the photoresist film and a second portion on the side surface of the photoresist film, in which a film thickness of the first portion is larger than that of the second portion, and the second film is formed at least on the first portion of the first film.

* * * * *